(12) United States Patent
Ohashi

(10) Patent No.: US 7,810,051 B2
(45) Date of Patent: Oct. 5, 2010

(54) LAYOUT METHOD, CAD APPARATUS, COMPUTER-READABLE PROGRAM AND COMPUTER-READABLE STORAGE MEDIUM

(75) Inventor: Masahiro Ohashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 594 days.

(21) Appl. No.: 11/504,625

(22) Filed: Aug. 16, 2006

(65) Prior Publication Data

US 2007/0162881 A1 Jul. 12, 2007

(30) Foreign Application Priority Data

Jan. 11, 2006 (JP) ............... 2006-004117

(51) Int. Cl.
*G06F 17/50* (2006.01)
(52) U.S. Cl. ............................. 716/1; 716/8
(58) Field of Classification Search ............ 716/1, 716/2, 8–10
See application file for complete search history.

(56) References Cited

U.S. PATENT DOCUMENTS

| | | | | |
|---|---|---|---|---|
| 6,230,304 B1* | 5/2001 | Groeneveld et al. | ............ | 716/7 |
| 6,756,242 B1* | 6/2004 | Regan | ............ | 438/14 |
| 7,007,258 B2* | 2/2006 | Li | ............ | 716/9 |
| 7,039,881 B2* | 5/2006 | Regan | ............ | 716/3 |
| 7,254,801 B1* | 8/2007 | Borer et al. | ............ | 716/16 |
| 2006/0206847 A1* | 9/2006 | Ogawa | ............ | 716/9 |

FOREIGN PATENT DOCUMENTS

| | | |
|---|---|---|
| JP | 4-242959 A | 8/1992 |
| JP | 7-160754 A | 6/1995 |
| JP | 2000-349158 | 12/2000 |
| JP | 2002-151592 | 5/2002 |

OTHER PUBLICATIONS

"Japanese Office Action", mailed by JPO and corresponding to Japanese application No. 2006-004117 on Feb. 23, 2010, with partial English translation.
"Japanese Office Action", mailed by JPO and corresponding to Japanese application No. 2006-004117 on Jul. 20, 2010, with partial English translation.

* cited by examiner

*Primary Examiner*—Jack Chiang
*Assistant Examiner*—Binh C Tat
(74) *Attorney, Agent, or Firm*—Fujitsu Patent Center

(57) ABSTRACT

A layout method for a layout design of a circuit includes a simulation step carrying out a simulation of the circuit, a specifying step specifying a maximum current value to flow between terminals of each of elements of the circuit and specifying a shape of each of the elements, and a layout composing step automatically creating and completing a layout of the elements so as to satisfy an electro migration rule, based on the specified maximum current value and shape of each of the elements.

12 Claims, 10 Drawing Sheets

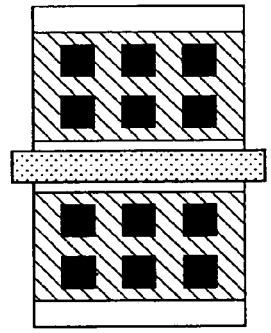
FIG.6A
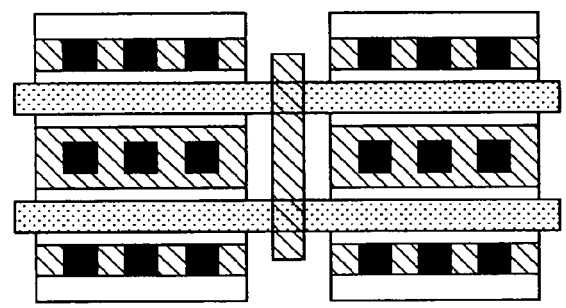
FIG.6B
FIG.6C
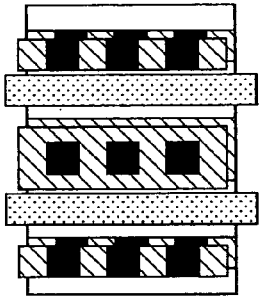
FIG.6D
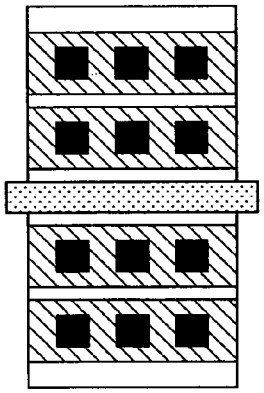
FIG.6E
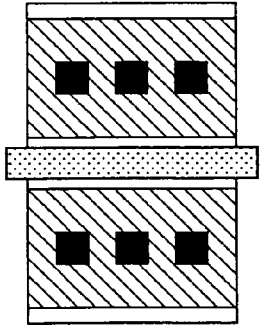
FIG.6F a.. metalContactEOL(mcEOL)
b.. Contact Space (cs)
c.. Contact Width(cw)
d.. metalContactEnc(mcEnc)
e.. mos Width
f.. metal Width

FIG.11

| m | S | D |
|---|---|---|
| 1 | 1 | 1 |
| 2 | 2 | 1 |
| 3 | 2 | 2 |
| 4 | 3 | 2 |
| 5 | 3 | 3 |
| 6 | 4 | 3 |

LAYOUT METHOD, CAD APPARATUS, COMPUTER-READABLE PROGRAM AND COMPUTER-READABLE STORAGE MEDIUM

BACKGROUND OF THE INVENTION

1. Field of the Invention

The present invention generally relates to layout methods, computer aided design (CAD) apparatuses, program and storage media, and more particularly to a layout method for making a layout design that takes into consideration an electro migration (EM) when designing semiconductor integrated circuits and devices by CAD, a CAD apparatus that employs such a layout method, a computer-readable program for causing a computer to make such a layout design, and a computer-readable storage medium which stores such a program.

2. Description of the Related Art

According to the conventional layout design, the layout of transistors, passive devices or elements and the like is manually created by a layout designer (or creator) so as to satisfy an electro migration rule. In addition, the shapes of the elements are normally obtained by calculation using a technique different from that of an apparatus that makes the layout design, and the layout designer manually reflects the shapes of the elements to the layout of the elements that is obtained by satisfying the electro migration rule. For this reason, there is a possibility of introducing errors caused by human error at the time of the layout.

A check to confirm whether or not the electro migration rule is satisfied can only be made after the layout is completed. If the electro migration rule is not satisfied and an electro migration problem is found, there is a possibility that the elements must be rearranged by modifying the size, shape and the like of the elements. In such a case, however, a design modification from a bulk layer is inevitable because the size, shape and the like of the elements change, and consequently, the number of operation steps or processes of the layout increases.

FIG. 1 is a flow chart for explaining an example of a conventional layout method. In FIG. 1, a step S1 carries out a simulation of a circuit that is the design target (hereinafter simply referred to as a target circuit). A step S2 specifies maximum current values of the currents flowing between terminals of each of the elements forming the target circuit, and the shapes of the elements (hereinafter simply referred to as element shapes). A step S3 creates a layout of the elements so as to satisfy an electro migration rule, based on the specified maximum current values and element shapes. When the layout of the elements is completed, a step S4 arranges the elements by taking into consideration wirings, so as to create the layout of the target circuit. When the layout of the target circuit is completed, a step S5 carries out a layout verification. In addition, a step S6 carries out a layout judgement to confirm whether or not the layout of the target circuit satisfies a design rule check (DRC) rule and a layout versus schematic (LVS) rule. The process returns to the step S4 if the judgement result in the step S6 is NO. On the other hand, if the judgement result in the step S6 is YES, a step S7 carries out an electro migration check, and a step S8 carries out an electro migration judgement to confirm whether or not the layout of the target circuit satisfies the electro migration rule.

If the judgement result in the step S8 is NO, (a) an electro migration rule violation may be generated at a portion other than the elements or, (b) an electro migration rule violation may be generated within the layout of the elements. In the first case (a), the process returns to the step S4. However, in the latter case (b), there is a high possibility that the size, shape and the like of the elements will be changed by the modification of the layout of the elements, and the process returns to the step S3 since it is necessary to rearrange the elements. If the judgement result in the step S8 is YES, a step S9 completes the layout of the target circuit.

Japanese Laid-Open Patent Applications No.2000-349158 and No.2002-151592 propose layout methods and apparatuses that change the wiring width between cells and the shape of via holes depending on tolerable current values.

Therefore, according to the conventional layout method, the operation to satisfy the electro migration rule when making the layout of the elements was carried out manually. For this reason, it was impossible to completely create the layout satisfying the electro migration rule when making the layout of the elements. In order to make the electro migration check, the simulation must be carried out by extracting the verifying portion in a state where the layout of the elements is completed. Furthermore, if an electro migration rule violation exists within the layout of the elements, the modification of the layout may extend to the bulk layer, and there were problems in that the number of operation steps of processes of the layout is increased and the turn around time (TAT) is increased.

SUMMARY OF THE INVENTION

Accordingly, it is a general object of the present invention to provide a novel and useful layout method, CAD apparatus, computer-readable program and computer-readable storage medium, in which the problems described above are suppressed.

Another and more specific object of the present invention is to provide a layout method, a CAD apparatus, a computer-readable program and a computer-readable storage medium, which can prevent an increase in the number of operation steps or processes of the layout and prevent an increase in the turn around time (TAT) when an electro migration rule violation of elements occurs when making the layout of the elements.

Still another object of the present invention is to provide a layout method for a layout design of a circuit, comprising a simulation step carrying out a simulation of the circuit; a specifying step specifying a maximum current value to flow between terminals of each of elements of the circuit and specifying a shape of each of the elements; and a layout composing step automatically creating and completing a layout of the elements so as to satisfy an electro migration rule, based on the specified maximum current value and shape of each of the elements. According to the layout method of the present invention, it is possible to prevent an increase in the number of operation steps or processes of the layout and prevent an increase in the turn around time (TAT) when an electro migration rule violation of elements occurs when making the layout of the elements.

A further object of the present invention is to provide a CAD apparatus for carrying out a layout design of a circuit, comprising a simulation part configured to carry out a simulation of the circuit, a specifying part configured to specify a maximum current value to flow between terminals of each of elements of the circuit and to specify a shape of each of the elements; and a layout composing part configured to automatically create and complete a layout of the elements so as to satisfy an electro migration rule, based on the specified maximum current value and shape of each of the elements. According to the CAD apparatus of the present invention, it is possible to prevent an increase in the number of operation steps or processes of the layout and prevent an increase in the turn around time (TAT) when an electro migration rule violation of elements occurs when making the layout of the elements.

Another object of the present invention is to provide a computer-readable program which causes a computer to carry out a layout design of a circuit, comprising a simulation procedure causing the computer to carry out a simulation of the circuit; a specifying procedure causing the computer to specify a maximum current value to flow between terminals of each of elements of the circuit and to specify a shape of each of the elements; and a layout composing procedure causing the computer to automatically create and complete a layout of the elements so as to satisfy an electro migration rule, based on the specified maximum current value and shape of each of the elements. According to the computer-readable program of the present invention, it is possible to prevent an increase in the number of operation steps or processes of the layout and prevent an increase in the turn around time (TAT) when an electro migration rule violation of elements occurs when making the layout of the elements.

Still another object of the present invention is to provide a computer-readable storage medium which stores the computer-readable program described above. According to the computer-readable storage medium according to the present invention, it is possible to prevent an increase in the number of operation steps or processes of the layout and prevent an increase in the turn around time (TAT) when an electro migration rule violation of elements occurs when making the layout of the elements.

Other objects and further features of the present invention will be apparent from the following detailed description when read in conjunction with the accompanying drawings.

BRIEF DESCRIPTION OF THE DRAWINGS

FIGS. 6A-6F are plan views showing examples of shapes of transistors;

FIG. 11 is a diagram showing the split number of the transistors for source and drain sides.

DESCRIPTION OF THE PREFERRED EMBODIMENTS

A description will be given of embodiments of a layout method, a CAD apparatus, a computer-readable program and a computer-readable storage medium according to the present invention, by referring to FIG. 2 and the subsequent drawings.

An embodiment of the CAD apparatus according to the present invention employs an embodiment of the layout method according to the present invention, an embodiment of the computer-readable program according to the present invention and an embodiment of the computer-readable storage medium according to the present invention. In this embodiment, the present invention is applied to a computer system. FIG. 2 is a perspective view showing the computer system applied with the present invention.

Figure 1:
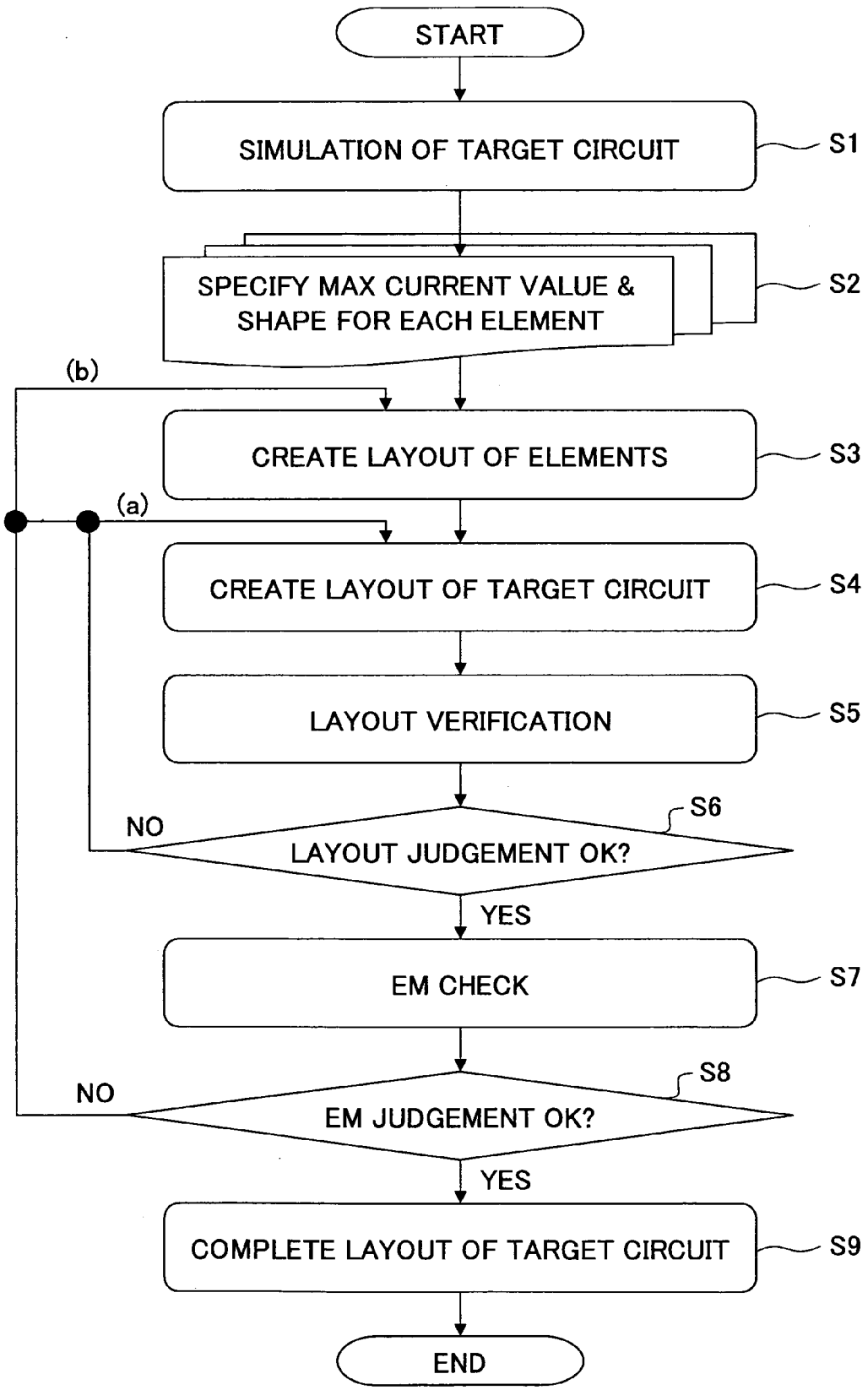
FIG. 1 is a flow chart for explaining an example of a conventional layout method.
Figure 2:
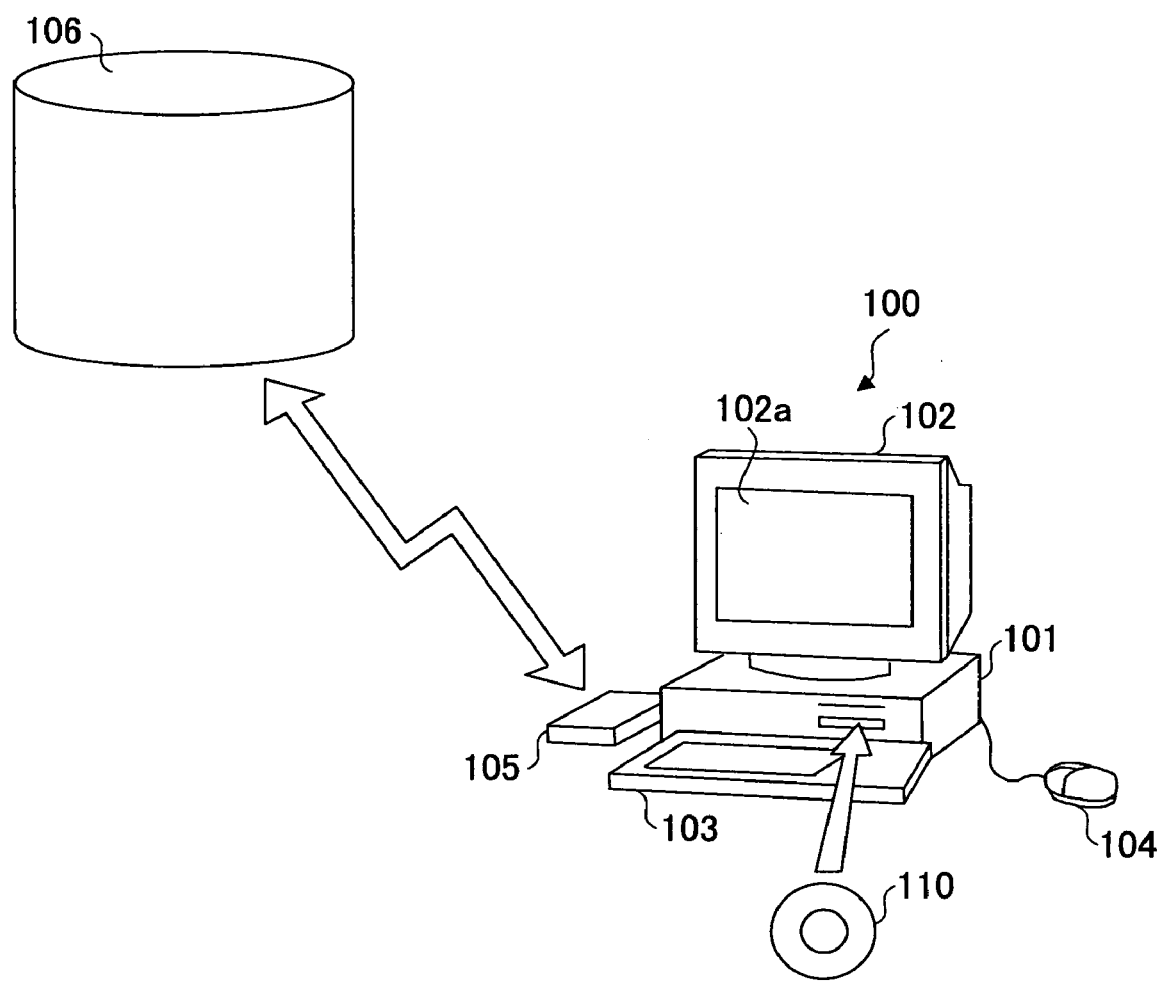
FIG. 2 is a perspective view showing a computer system applied with the present invention.

A computer system 100 shown in FIG. 2 has a main body part 101, a display 102, a keyboard 103, a mouse 104 and a modem 105. The main body part 101 includes a CPU, a disk drive and the like. The display 102 displays images on a display screen 102a in response to an instruction from the main body part 101. The keyboard 103 is used by a user to input various information to the computer system 100. The mouse 104 is used by the user to specify an arbitrary position on the display screen 102a of the display 102. The modem 105 makes access to an external database or the like and downloads programs and the like stored in another computer system.

The computer-readable program (CAD software or layout design software) of this embodiment for making the computer system 100 have a CAD function or at least a layout design function of the CAD function, which is stored in a portable recording medium such as a disk 110 or, downloaded from a recording medium 106 of another computer system using a communication unit such as the modem 105, is input to the computer system 100 and compiled therein. The program of this embodiment operates the computer system 100 (that is, a CPU 201 which will be described later) as the CAD apparatus of this embodiment having the CAD function. The computer-readable storage medium of this embodiment is formed by a computer-readable recording medium, such as the disk 110, that stores the program of this embodiment. The recording medium forming the computer-readable storage medium of this embodiment is not limited to portable recording media such as the disk 110, IC card memories, magnetic disks including floppy (registered trademark) disks, magneto-optical disks and CD-ROMs. The recording medium forming the computer-readable storage medium of this embodiment includes various recording media accessible by the computer system that is connected via the communication unit or communication means such as the modem 105 and the LAN.

Figure 3:
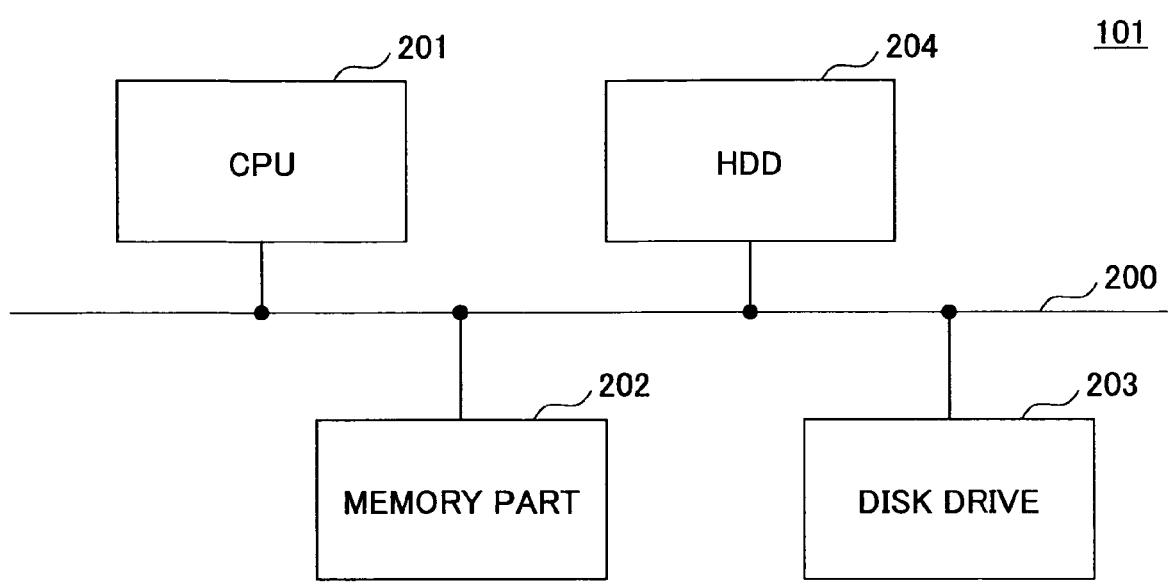
FIG. 3 is a system block diagram showing an important part of a computer system shown in FIG. 2.

FIG. 3 is a system block diagram showing an important part within the main body part 101 of the computer system 100 shown in FIG. 2. In FIG. 3, the main body part 101 includes a CPU 201, a memory part 202, a disk drive 203 and a hard disk drive 204 that are connected via a bus 200. The memory part 202 includes a RAM, a ROM and the like. The disk drive 203 is provided for the disk 110. In this embodiment, the display 102, the keyboard 103 and the mouse 104 are also connected to the CPU 201 via the bus 200, but it is of course possible to connect the display 102, the keyboard 103 and the mouse 104 directly to the CPU 201. In addition, the display 102 may be connected to the CPU 201 via a known graphic interface (not shown) that processes input and output image data.

Of course, the structure of the computer system 100 is not limited to the structure shown in FIGS. 2 and 3, and other known structures may be used instead.

Figure 4:
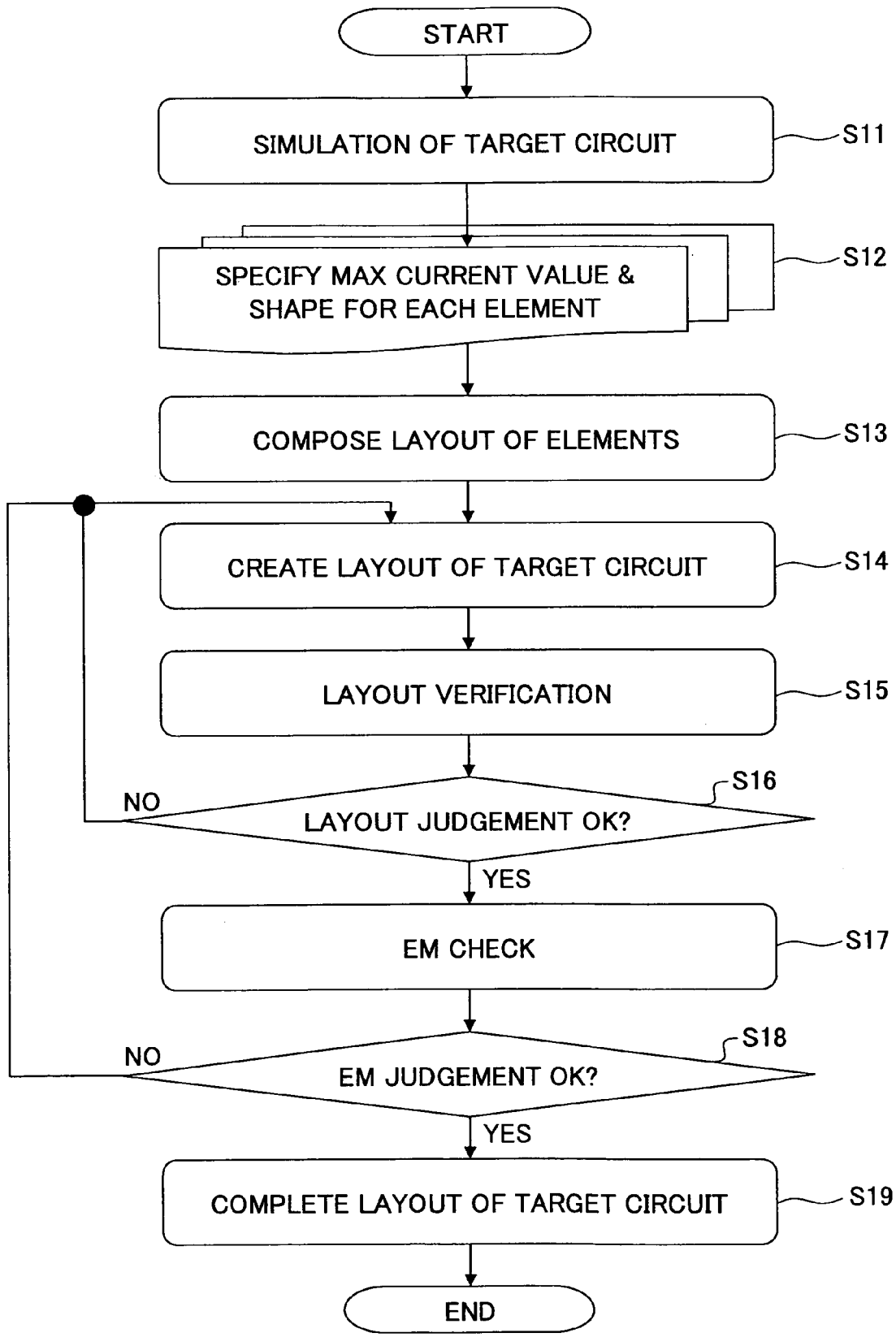
FIG. 4 is a flow chart for explaining an operation of an embodiment of the present invention.

FIG. 4 is a flow chart for explaining an operation of this embodiment of the present invention. Processes of steps S11 through S19 correspond to procedures of the program, and are executed by the CPU 201, that is, by corresponding parts or means of the computer system 100, with respect to a target circuit that is to be designed, for example.

In FIG. 4, the step S11 carries out a simulation of the target circuit that is to be designed. The step S12 specifies a maximum current value to flow between terminals of each element forming the target circuit and a shape of each element (hereinafter also referred to as element shape). For example, in a case where the element is a transistor, parameters l, w, m and the like that are used by a Parameterized cell (Pcell) and are capable of controlling the layout of the element are input from the keyboard 103 or, read from the memory part 202 or the like or, input from another computer system via the modem 105, so as to specify a shape of the transistor (hereinafter also referred to as a transistor shape). The Pcell will be described later in more detailed.

The step S13 carries out an element layout composing process that automatically creates and completes the element layout so as to satisfy an electro migration (EM) rule. When the element layout composing process is completed, the step S14 arranges the elements by reducing the element pitch to a certain extent by taking into consideration the wirings, so as to create the layout of the target circuit. When the layout of the target circuit is completed, the step S15 carries out a layout verification. In addition, the step S16 carries out a layout judgement to confirm whether or not the layout of the target circuit satisfies a design rule check (DRC) rule and a layout versus schematic (LVS) rule. The process returns to the step S14 if the judgement result in the step S16 is NO.

On the other hand, if the judgement result in the step S16 is YES, the step S17 carries out an electro migration (EM) check. In addition, the step S18 carries out an electro migration (EM) judgement to confirm whether or not the layout of the target circuit satisfies the electro migration (EM) rule. If the judgement result in the step S18 is NO, the process returns to the step S14 because an electro migration rule violation is generated at a portion other than the element. On the other hand, if the decision result in the step S18 is YES, the step S19 completes the layout of the target circuit.

Therefore, it is possible to realize the element layout satisfying the electro migration rule by setting the maximum current that is obtained by the simulation and by setting how the elements should be arranged. In a case where the element layout satisfying the electro migration rule cannot be created from the given parameters and element shapes, an error message or an error (or warning) frame is displayed on the display screen 102a, for example, so as to notify the user that the element layout cannot be created.

Figure 5:
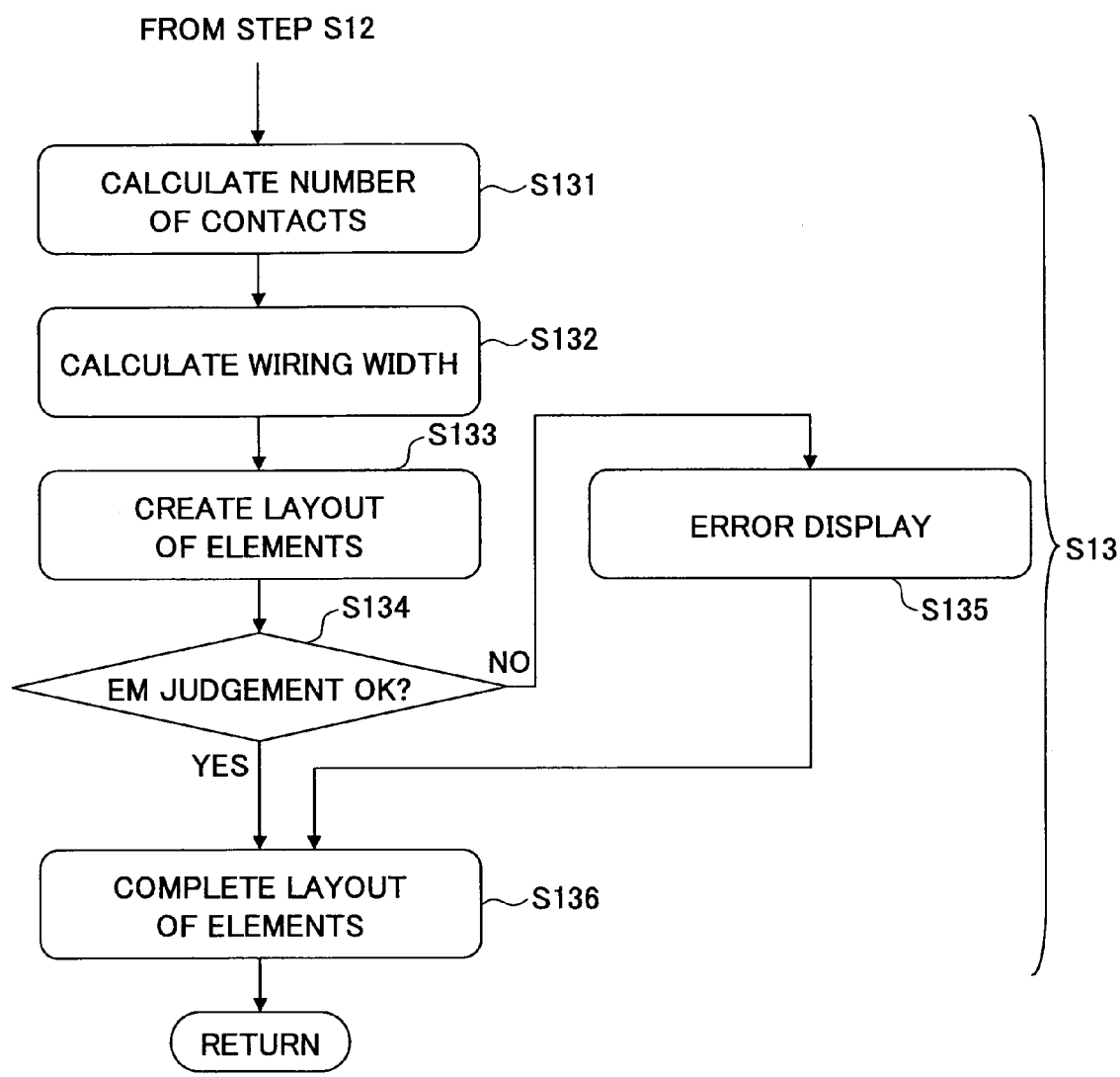
FIG. 5 is a flow chart for explaining an element layout composing process.

FIG. 5 is a flow chart for explaining the element layout composing process that is carried out by the step S13 shown in FIG. 4. In FIG. 5, a step S131 calculates a number of contacts of the element satisfying the electro migration rule, and a step S132 calculates a wiring width of the element satisfying the electro migration rule. For example, in the case where the element is a transistor, the wiring width of a source terminal and a drain terminal of the transistor is calculated. A step S133 arranges the element by taking into consideration the parameters such as the number of contacts and the wiring width of the element satisfying the electro migration rule, and creates the element layout. A step S134 carries out an electro migration judgement to confirm wither or not the element layout satisfies the electro migration rule. If the judgement result in the step S134 is NO, a step S135 creates a warning to notify the user that the element layout cannot be created due to the generation of an error, and the process advances to a step S136 after displaying an error message or an error (or warning) frame on the display screen 102a, for example. The error message or the error frame may be displayed over or with the layout that is displayed on the display screen 102a. If the judgement result in the step S134 is YES or, after the step S135, the step S136 completes the element layout, and the process returns to the step S14 shown in FIG. 4.

As described above, the element layout that takes into consideration the electro migration rule is automatically created at an early stage of the layout design. For this reason, with regard to the element layout, there is no backward process and no increase in the number of processes (or steps) of the layout operation caused by the electro migration violation, and the corresponding increase in the turn around time (TAT) can be prevented. In addition, since the electro migration judgement is made within the CAD apparatus (that is, the CAD function), it is possible to improve the quality of the layout design.

Furthermore, even if a change made in the parameters is such that the maximum current value cannot be applied, for example, when modifying the element layout by a manual operation, it is possible to urge the user to adjust the element layout by notifying the generation of an error to the user.

The Analog Artist (product name) manufactured by CADENCE is one example of the CAD software to which the present invention may be applied. The Analog Artist includes the Composer (registered trademark) for circuit diagram entry, the Spectre (registered trademark) as a simulator for confirming the maximum current value, the Virtuoso XL (registered trademark) as a net-list-driven layout apparatus, and the Parameterized cell (Pcell) that can control the element layout of the elements such as transistors by the parameters. The present invention may be realized by providing a function of taking into consideration the electro migration to the Pcell that creates the element layout of the elements such as the transistors and passive elements.

FIGS. 6A through 6F are plan views showing examples of the shapes of transistors (Pcell), that is, the transistor shapes. FIG. 6A shows a default shape of the transistors, FIG. 6B shows a multi-row shape in which the transistors are arranged in a plurality of rows, FIG. 6C shows a 2-contact-column shape in which the contacts of the transistors are arranged in two columns, FIG. 6D shows a large metal layer width shape in which the width of the metal layer is large, FIG. 6E shows a 2-metal-layer column shape in which the metal layer is arranged in two columns, and FIG. 6F shows a stack layer shape having a stack layer structure. The transistor shape may be changed manually as in the case of the multi-row shape or the stack layer shape, but in this embodiment, the transistor shape is basically changed automatically so as to satisfy the electro migration rule.

Figure 7A:
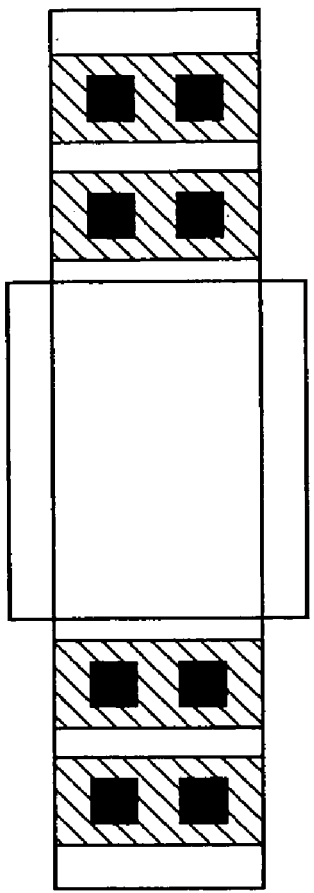
FIGS. 7A-7C are plan views showing examples of layouts of elements.
Figure 7B:
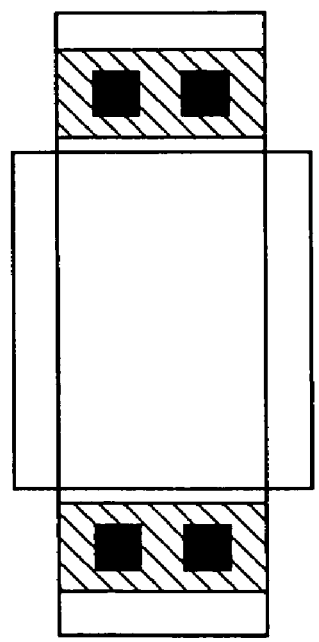
Figure 7C:
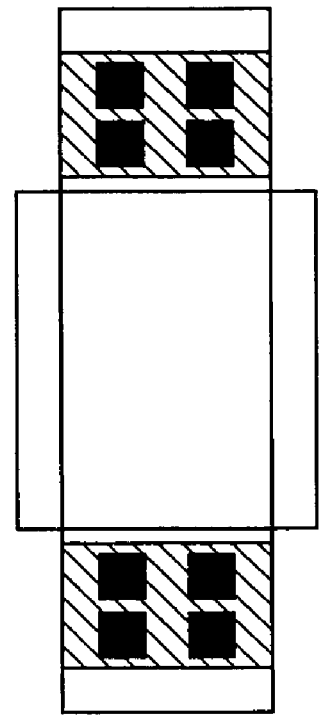

FIGS. 7A through 7C are plan views showing examples of the layouts of elements, that is, the element layouts. FIG. 7A shows a default shape of the elements, FIG. 7B shows a layout of the elements with respect to the 2-metal-layer-column shape, and FIG. 7C shows a layout of the elements with respect to the 2-contact-column shape. When a resistor made up of a polysilicon layer is taken as an example, it is necessary to confirm the electro migration rule of the polysilicon itself, but it is also necessary to take into consideration the electro migration rule of terminal draw-out (or lead) portions.

Figure 8A:
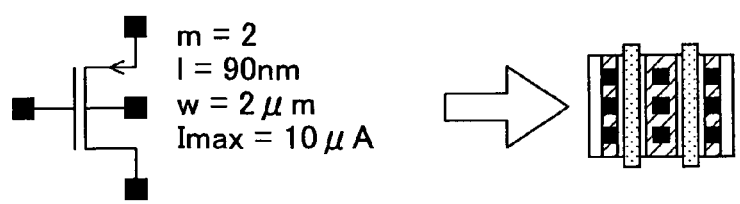
FIGS. 8A-8F are diagrams for explaining automatic generation of transistor shapes using Pcell.
Figure 8B:
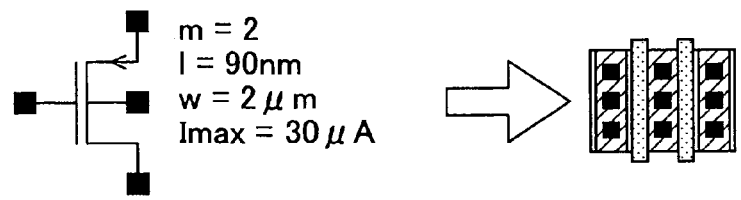
Figure 8C:
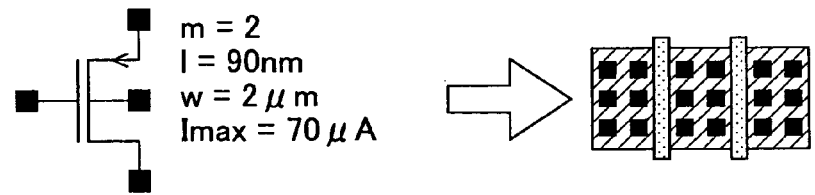

FIGS. 8A through 8F are diagrams for explaining the automatic generation of the transistor shapes using the Pcell. In each of FIGS. 8A-8F, the left portion indicates a circuit diagram of the transistor displayed on the display screen 102a and for which the parameters may be specified, while the right portion indicates the transistor shape that is automatically generated by specifying the parameters. The transistor shape that is automatically generated may also be displayed on the display screen 102a. FIGS. 8A through 8C show cases where a maximum current value Imax is specified and the parameters m, l and w are constant and not specified, that is, the transistor shape is not specified. It may be seen from FIGS. 8A through 8C that the metal layer width (metal width) and the number of contacts change by increasing a drain-source current that flows between the drain and the source of the transistor. Of course, the maximum current value Imax of the drain-source current is not limited to the values shown in FIGS. 8A through 8F.

Figure 8D:
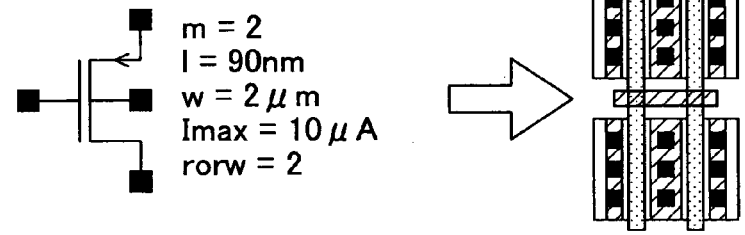
Figure 8E:
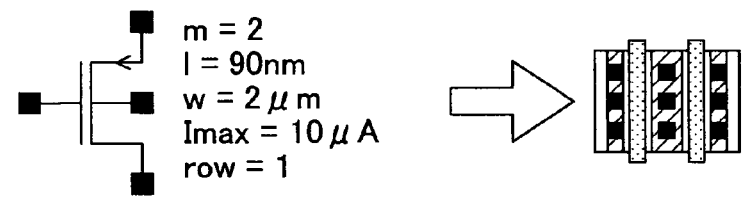
Figure 8F:
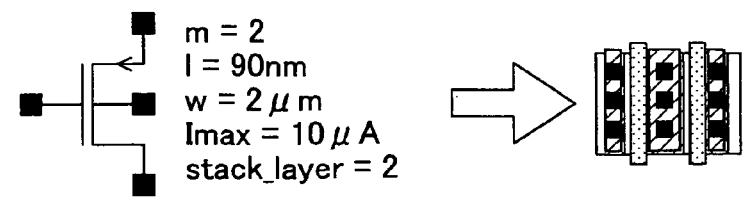

FIGS. 8D through 8F show cases where the maximum current value Imax is not specified and is constant, and the parameters m, l and w are specified, that is, the transistor shape is specified. FIG. 8D shows the stack layer shape, that is, the transistor shape for the case where the transistor has a vertical structure. FIG. 8E shows the transistor shape comparable to the transistor shapes shown in FIGS. 8A through 8C. FIG. 8F shows the multi-row shape, that is, the case where two vertical layers of the source and drain draw-out (or lead) lines are used. The transistor shape shown in FIG. 8F is an effective shape in a case where the reason why the electro migration rule cannot be satisfied is not due to the contacts but due to the wirings.

Figure 9:
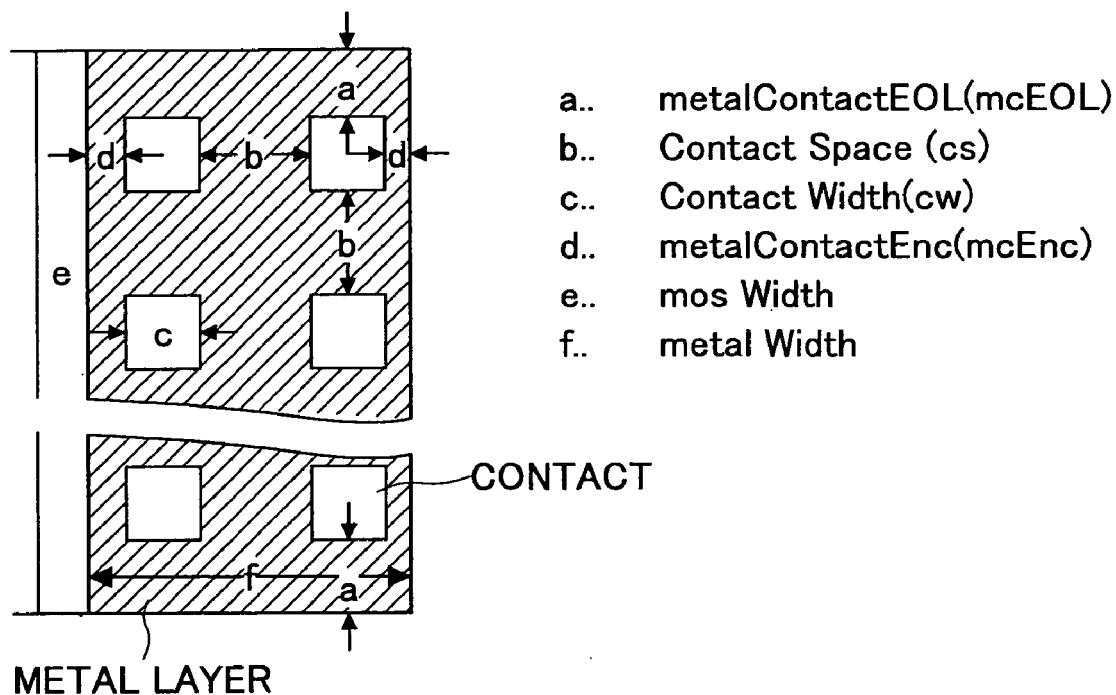
FIG. 9 is a plan view for explaining variable names for describing algorithms.

FIG. 9 is a plan view for explaining variable names for describing algorithms described hereunder. As shown in FIG. 9, variable names of distances (or lengths) "a", "b", "c", "d", "e" and "f" respectively are "metalContactEOK (mcEOL)", "ContactSpace (cs)", "ContactWidth (cw)", "metalContactEnc (mcEnc)", "mosWidth" and "metalWidth".

A description will be given of a method of calculating the maximum current value Imax flowing through a metal layer (Metal) and a contact for a case where a split number (number of splits) m of the transistors is m=1.

A maximum current I_perMetal flowing through the metal layer may be calculated from the following formula (1), where $\alpha$ denotes a coefficient attributable to the physical structure of the metal layer and TF denotes a coefficient attributable to the temperature.

$$I\_perMetal = \alpha \cdot TF \cdot metalWidth\ [A] \tag{1}$$

In addition, a maximum current I_perContact that may be caused to flow per contact may be calculated from the following formula (2), where $\beta$ denotes a coefficient attributable to the physical structure of the contact.

$$I\_perContact = \beta \cdot TF\ [A] \tag{2}$$

The following formulas (1A) and (2A) can be obtained from the formulas (1) and (2) described above.

$$metalwidth = Imax/(\alpha \cdot TF) \tag{1A}$$

$$n = Imax/(\beta \cdot TF) \tag{2A}$$

The number of contacts that can be arranged within the distance "e" or mosWidth is calculated from the formula (2A). If a maximum number of contacts that can be arranged in one column within the predetermined distance "e" or mosWidth is denoted by n1, this number n1 can be obtained from the following formula (3).

$$moswidth > cw \cdot n1 + cs(n1-1) + 2mcEOL > cw \cdot n1 + cs \cdot n1 - cs + 2mcEOL > n1(cw+cs) - cs + 2mcEOL$$

$$\text{Thus, } n1 < (mosWidth + cs - 2mcEOL)/(cw+cs) \tag{3}$$

If the following formula (4) does not stand, it means that the contacts cannot be arranged in one column, and it is necessary to obtain a number i of contact columns satisfying the formula (4).

$$n/i \leq n1, \text{ where } i=1, 2, 3, \tag{4}$$

However, since the value of i is finite and is obtained from a maximum value of metalWidth determined by a mask design rule, the number i can be obtained from the following formula (5), where metalWidth_max denotes the maximum value of metalWidth determined by the mask design rule.

$$metalWidth\_max > i \cdot cw + (i-1) \cdot cs + 2mcEnc > i \cdot cw + i \cdot cs - cs + 2mcEnc$$

$$\text{Thus, } i < (metalWidth\_max + cs - 2mcEnc)/(cw+cs) \tag{5}$$

If the formula (5) is not satisfied, it means that the mask design rule cannot be satisfied by this shape, and an error message or error frame is displayed on the display screen 102a.

Figure 10:
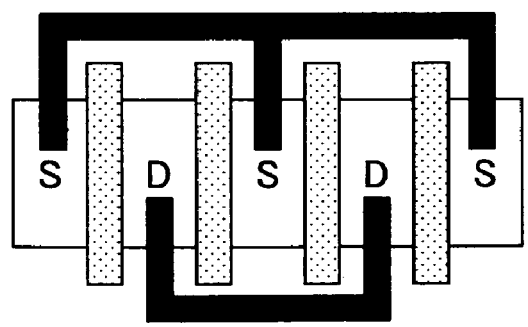
FIG. 10 is a diagram for explaining a split number of transistors.
Figure 11:
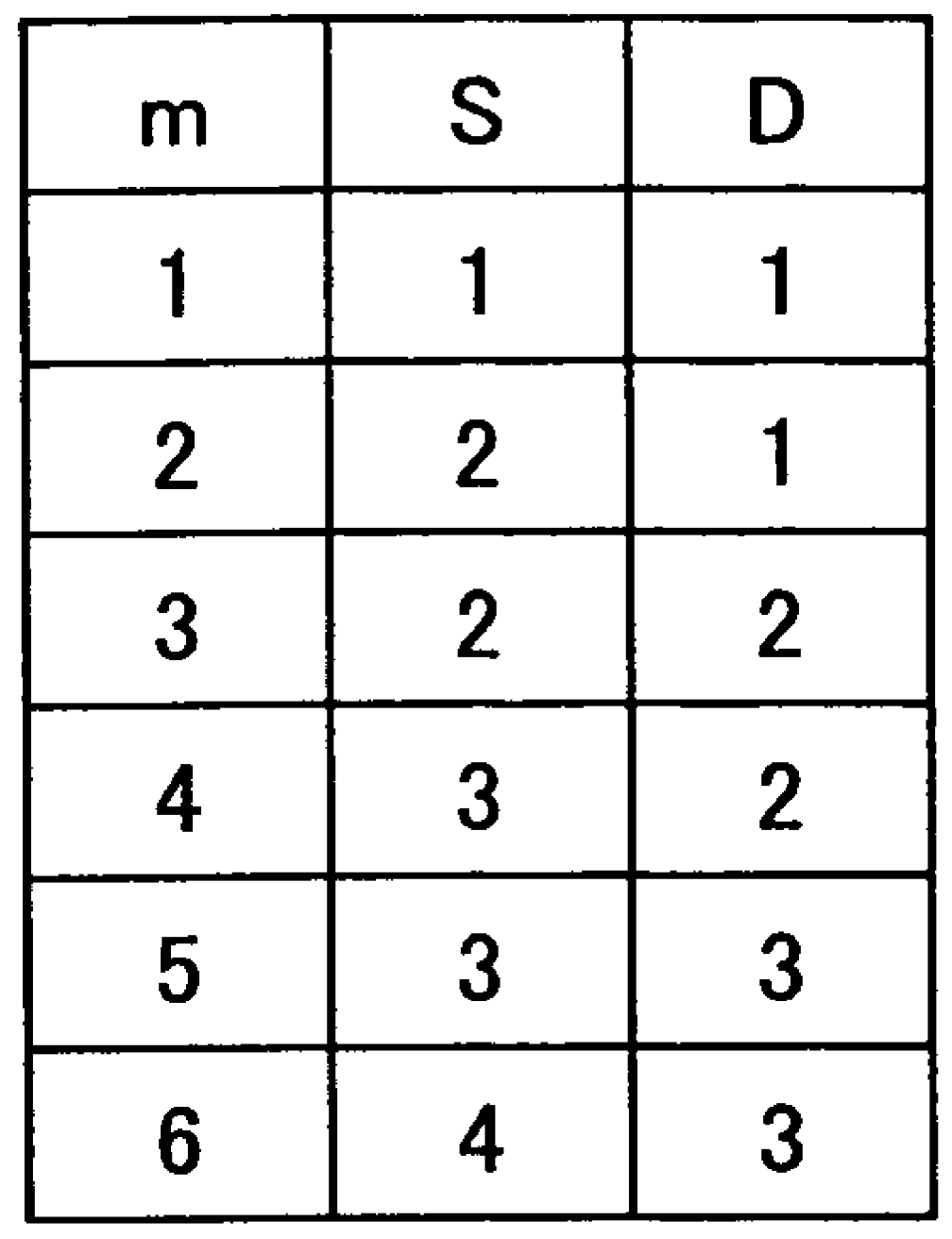

Next, a description will be given of a case where m>1. Unlike the case where m=1, in the case where m>1, the current flowing through each transistor is not Imax because the transistors are split. For this reason, compared to the case where m=1, the calculation becomes slightly more difficult. As may be seen from FIGS. 10 and 11, when the source is on the outer side, the split number on the drain side is always the same as or one less than the split number on the source side. FIG. 10 is a diagram for explaining the split number of the transistors, and FIG. 11 is a diagram showing the split number of the transistors for the source side (S) and the drain side (D). Accordingly, the split number on the drain side, which is always the smaller split number, may be used for the calculation. A node division number D on the drain side may be calculated from the following formula (6), where a function int is a function which rounds down or omits the fractions.

$$D = int\{(m+1)/2\} \tag{6}$$

A maximum current value Imax_split for the case where the transistor is split may be obtained from the following formula (7) based on the formula (6) above.

$$Imax\_split = Imax/int\{(m+1)/2\} \tag{7}$$

With regard to an inner portion surrounded by two transistor gates and an outer portion not surrounded by the transistor gates, it is necessary to be able to apply to the inner portion surrounded by the two transistor gates a current that is two times the current that can be applied to the outer portion. For this reason, the respective distances metalWidth, that is, a distance metalWidth_in of the inner portion and a distance metalWidth_out of the outer portion can be obtained from the following formulas (8) and (9), based on the formulas (1A) and (7) described above.

$$metalWidth\_in = Imax\_split/(\alpha \cdot TF) \cdot 2 \tag{8}$$

$$metalWidth\_out = Imax\_split/(\alpha \cdot TF) \tag{9}$$

The number n of contacts that are necessary may be obtained from the following formula (10), based on the formulas (2A) and (7) described above.

$$n = Imax\_split/(\beta \cdot TF) \tag{10}$$

With regard to the contact in the inner portion surrounded by two transistor gates and the contact in the outer portion not surrounded by the transistor gates, it is necessary to be able to apply to the contact in the inner portion surrounded by the two transistor gates a current that is larger than the current that can be applied to the contact in the outer portion. For this reason, the respective number n of contacts, that is, a number n_in of contacts in the inner portion and a number n_out of contacts in the outer portion can be obtained from the following formulas (11) and (12), based on the formula (10) described above.

$$n\_in = Imax\_split/(\beta \cdot TF) \cdot 2 \tag{11}$$

$$n\_out = Imax\_split/(\beta \cdot TF) \tag{12}$$

If the number of rows of transistors increases in FIG. 8E, for example, the values of the formulas (8) and (9) must be multiplied by the number of rows. In addition, if the stack layer shown in FIG. 8F is employed, the distance metalWidth can be made short (that is, narrow), but it is necessary to take into consideration the fact that there is a possibility of increasing the number n of contacts.

This application claims the benefit of a Japanese Patent Application No.2006-004117 filed Jan. 11, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. A layout method for a layout design of a circuit, to be implemented in a computer, said layout method comprising:
    carrying out, by the computer, a simulation of the circuit;
    specifying, with respect to the computer, a maximum current value to flow between terminals of each of elements of the circuit;
    specifying, with respect to the computer, parameters that determine a shape of each of the elements; and
    automatically creating and completing, by the computer, a layout of the elements satisfying an electro migration rule, based on the specified maximum current value and shape of each of the elements,
    wherein the automatically creating and completing the layout comprises:
        calculating, by the computer, a number of contacts and a wiring width of each of the elements satisfying the electro migration rule;
        creating, by the computer, the layout of the elements by taking into consideration the number of contacts and the wiring width that are calculated; and
        carrying out, by the computer, an electro migration judgement so as to confirm whether or not the layout of the elements satisfies the electro migration rule.

2. The layout method as claimed in claim 1, wherein the automatically creating and completing the layout displays, by the computer, a warning to notify a user that the layout of the elements cannot be created due to generation of an error, if it is judged by the electro migration judgement that the layout of the elements violates the electro migration rule.

3. The layout method as claimed in claim 1, further comprising:
    displaying, by the computer, an error if the layout of the elements created by the automatically creating and completing the layout violates the electro migration rule.

4. The layout method as claimed in claim 1, further comprising:
    creating, by the computer, the layout of the circuit by arranging the elements after the automatically creating and completing the layout;
    carrying out, by the computer, a layout verification with respect to the layout of the circuit; and
    carrying out, by the computer, an electro migration judgement to confirm whether or not the electro migration rule is satisfied if no problem exists in the layout of the circuit as a result of the layout verification.

5. A CAD apparatus for carrying out a layout design of a circuit, comprising:
    a simulation part configured to carry out a simulation of the circuit;
    a specifying part configured to specify a maximum current value to flow between terminals of each of elements of the circuit and to specify parameters that determine a shape of each of the elements; and
    a layout composing part configured to automatically create and complete a layout of the elements satisfying an electro migration rule, based on the specified maximum current value and shape of each of the elements,
    wherein the layout composing part comprises:
        a part configured to calculate a number of contacts and a wiring width of each of the elements satisfying the electro migration rule;
        a part configured to create the layout of the elements by taking into consideration the number of contacts and the wiring width that are calculated; and
        a part configured to carry out an electro migration judgement so as to confirm whether or not the layout of the elements satisfies the electro migration rule.

6. The CAD apparatus as claimed in claim 5, further comprising:
    a display,
    wherein the layout composing part displays on the display a warning to notify a user that the layout of the elements cannot be created due to generation of an error, if it is judged by the electro migration judgement that the layout of the elements violates the electro migration rule.

7. The CAD apparatus as claimed in claim 5, further comprising:
    a display; and
    an error display part configured to display an error on the display if the layout of the elements created by the layout composing step violates the electro migration rule.

8. The CAD apparatus as claimed in claim 5, further comprising:
    a layout part configured to create the layout of the circuit by arranging the elements after the layout composing step;
    a layout judging part configured to carry out a layout verification with respect to the layout of the circuit; and
    an electro migration judging part configured to carry out an electro migration judgement to confirm whether or not the electro migration rule is satisfied if no problem exists in the layout of the circuit as a result of the layout verification.

9. A computer-readable medium that stores a computer program executable to perform a process comprising:
    carrying out a simulation of the circuit;
    specifying a maximum current value to flow between terminals of each of elements of the circuit;
    specifying parameters that determine a shape of each of the elements; and
    automatically creating and completing a layout of the elements satisfying an electro migration rule, based on the specified maximum current value and shape of each of the elements;
    wherein the computer program is to be executed by a computer to carry out a layout design of a circuit, and
    the automatically creating and completing the layout comprises:
        calculating a number of contacts and a wiring width of each of the elements satisfying the electro migration rule;
        creating the layout of the elements by taking into consideration the number of contacts and the wiring width that are calculated; and
        carrying out an electro migration judgement so as to confirm whether or not the layout of the elements satisfies the electro migration rule.

10. The computer-readable medium as claimed in claim 9, wherein the automatically creating and completing the layout displays a warning to notify a user that the layout of the elements cannot be created due to generation of an error, if it is judged by the electro migration judgement that the layout of the elements violates the electro migration rule.

11. The computer-readable medium as claimed in claim 9, said process further comprising:
displaying an error once the layout of the elements created by the layout composing procedure violates the electro migration rule.

12. The computer-readable medium as claimed in claim 9, said process further comprising:

creating the layout of the circuit by arranging the elements after the layout composing step;

carrying out a layout verification with respect to the layout of the circuit; and carrying out an electro migration judgement to confirm whether or not the electro migration rule is satisfied if no problem exists in the layout of the circuit as a result of the layout verification.

\* \* \* \* \*